United States Patent
Hu et al.

(10) Patent No.: US 7,122,124 B2
(45) Date of Patent: Oct. 17, 2006

(54) METHOD OF FABRICATING FILM CARRIER

(75) Inventors: Dyi-Chung Hu, Jhudong Township, Hsinchu County (TW); Chih-Kung Huang, Hsinchu (TW); Chien-Nan Wu, Taipei (TW)

(73) Assignee: Kingtron Electronics Co., Ltd., Hsinchu (TW)

( * ) Notice: Subject to any disclaimer, the term of this patent is extended or adjusted under 35 U.S.C. 154(b) by 0 days.

(21) Appl. No.: 10/906,682

(22) Filed: Mar. 2, 2005

(65) Prior Publication Data

US 2005/0194349 A1    Sep. 8, 2005

(30) Foreign Application Priority Data

Mar. 2, 2004    (TW) ............... 93105345 A

(51) Int. Cl.
- *B44C 1/22* (2006.01)
- *C03C 15/00* (2006.01)
- *C03C 25/68* (2006.01)
- *C23F 1/00* (2006.01)

(52) U.S. Cl. ...................................... 216/41; 257/692

(58) Field of Classification Search ................. 216/41; 257/692; 438/106
See application file for complete search history.

(56) References Cited

U.S. PATENT DOCUMENTS

| | | | | |
|---|---|---|---|---|
| 5,025,348 A | * | 6/1991 | Suzuki et al. | 361/751 |
| 5,038,996 A | * | 8/1991 | Wilcox et al. | 228/121 |
| 5,217,849 A | * | 6/1993 | Chonan et al. | 430/314 |
| 6,130,110 A | * | 10/2000 | Hashimoto | 438/106 |
| 2003/0170444 A1 | * | 9/2003 | Stewart | 428/317.7 |

* cited by examiner

*Primary Examiner*—Nadine Norton
*Assistant Examiner*—Mahmoud Dahimene
(74) *Attorney, Agent, or Firm*—Jianq Chyun IP Office

(57) ABSTRACT

A method of fabricating a film carrier is provided. The method comprises the steps of providing a film; forming a metallic layer on the film, patterning the metallic layer by etching to form a plurality of metallic leads; and, patterning the film by etching to form a plurality of openings so that processing time and manufacturing cost are reduced.

13 Claims, 6 Drawing Sheets

METHOD OF FABRICATING FILM CARRIER

CROSS-REFERENCE TO RELATED APPLICATION

This application claims the priority benefit of Taiwan application serial no. 93105345, filed on Mar. 2, 2004.

BACKGROUND OF THE INVENTION

1. Field of the Invention

The present invention relates to a method of fabricating a carrier. More particularly, the present invention relates to a method of fabricating a film carrier.

2. Description of Related Art

With the great advance in the electronics industry, many types of multifunctional electronic products have become indispensable in our daily life. Most electronic products are driven or controlled by integrated circuits on a die. To protect the structurally weak die and facilitate reliable signal transmission, the die is generally enclosed within a package. In the past, many types of chip packages have been developed. The most common chip bonding techniques include wire bonding (W/B), flip chip (F/C) bonding and tape automatic bonding (TAB). In the TAB technique, a silicon chip is bonded to a film carrier. Since the chip is bonded to a thin film, the TAB package is slim, light, flexible and easy to install.

FIGS. 1A through 1J are schematic cross-sectional views showing the progression of steps of fabricating a conventional film carrier. First, as shown in FIG. 1A, a film 100 is provided. Next, an adhesive layer 110 is formed over the film 100. As shown in FIG. 1B, the film 100 is punched using a cutting tool (not shown) to form a plurality of holes 102 in the film 100. The holes 102 are, for example, sprocket holes used for driving the film 100 forward in a subsequent automatic bonding process or device holes. As shown in FIG. 1C, a metallic layer 120 is laminated on the film 100. Through the adhesive layer 110, the bonding strength between the film 100 and the metallic layer 120 is enhanced.

As shown in FIG. 1D, a flex coating material is deposited into some of the openings 102 to form a flex coat layer 130 that permits the film 100 to flex along the flex coat layer 130. As shown in FIG. 1E, a first photoresist layer P10 having a plurality of opening 01 thereon is formed over the metallic layer 120. In the meantime, a second photoresist layer P20 is formed on the surface of the film 100 away from the metallic layer 120. As shown in FIG. 1F, using the first photoresist layer P10 as an etching mask, a portion of the metallic layer 120 is removed so that the metallic layer 120 is patterned to form a plurality of metallic leads 122. Thereafter, the first photoresist layer P10 and the second photoresist layer P20 are removed to form the structure shown in FIG. 1G.

As shown in FIG. 1H, a first tin layer 140 is formed on the surface of the metallic leads 122. Next, as shown in FIG. 1I, an anti-soldering layer 150 is formed on the surface of a portion of the first tin layer 140. Thereafter, as shown in FIG. 1J, a second tin layer 160 is formed on the remaining surface of the first tin layer 140.

In the conventional method of fabricating film carrier, holes are cut using punching tools. Since the size and location of the holes in the film carrier are different for each batch of chips, a different set of cutting tools has to be made for the production of a fresh new batch of products. In other words, excessive time and labor are needed for fabricating necessary cutting tools, thereby increasing the cost of the film carrier. Furthermore, the metallic layer is formed on the film after holes are fabricated on the film. Hence, the metallic layer may have some unevenness around the openings.

SUMMARY OF THE INVENTION

Accordingly, the present invention is directed to a method of fabricating a film carrier capable of shortening production time and lowering production cost.

According to an embodiment of the present invention, the method of fabricating a film carrier is capable of producing a highly uniform metallic layer for forming metallic leads.

According to an embodiment of the present invention, first, a film is provided. Next, a first photoresist layer having a plurality of first opening thereon is formed on the metallic layer and a second photoresist layer having a plurality of second openings is formed on the film away from the metallic layer. Thereafter, using the first photoresist layer as an etching mask, a portion of the metallic layer is removed to form a plurality of metallic leads. A third photoresist layer is formed over the metallic leads and the first photoresist layer. Using the second photoresist layer as an etching mask, a portion of the film is removed to form a plurality of openings in the film. Finally, the first photoresist layer, the second photoresist layer and the third photoresist layer are removed.

In an embodiment of the present invention, an adhesive layer may also be attached to the film before forming the metallic layer. The metallic layer is a copper layer, for example. Furthermore, a surface treatment of the metallic layer may be carried out before forming the first photoresist layer over the metallic layer and the second photoresist layer over the film layer. The surface treatment includes performing a chemical polishing or a micro etching process, for example.

In an embodiment of the present embodiment, the first photoresist layer and the second photoresist layer can be dry films or liquid photoresist layers, for example. Furthermore, a flex coat material may also be deposited to fill some of the openings before removing the first photoresist layer, the second photoresist layer and the third photoresist layer.

In an embodiment of the present invention, a first solder flux layer is formed on the metallic leads after forming the metallic leads after removing the first photoresist layer, the second photoresist layer and the third photoresist layer. After forming the first solder flux layer, an anti-soldering layer is formed on the surface of a portion of the first solder flux layer. Thereafter, a second solder flux layer is formed on the remaining surface of the first solder flux layer. The first and the second solder flux layers are tin layers, for example.

In an embodiment of the present invention, a finished product inspection is carried out after forming the second solder flux layer over the remaining surface of the first solder flux layer. The finished product inspection includes an electrical test and a visual check, for example.

In an embodiment of the present invention, an etching operation is performed to form the holes in the film so that the cost of providing a set of cutting tools for punching holes in the film can be avoided. In addition, the surface of the film is flat and free of holes when the metallic layer is formed over the film. Thus, the metallic layer can adhere uniformly to the film surface and avoid any unevenness around the openings.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
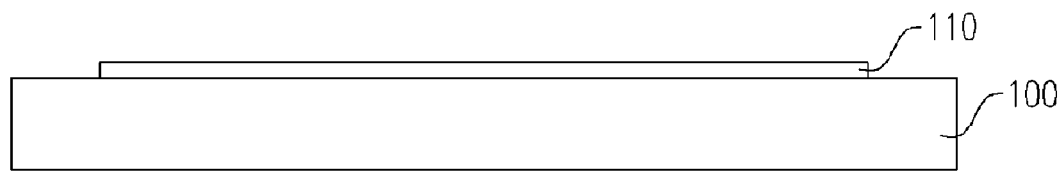
FIGS. 1A through 1J are schematic cross-sectional views showing the progression of steps of fabricating a conventional film carrier.
Figure 1B:
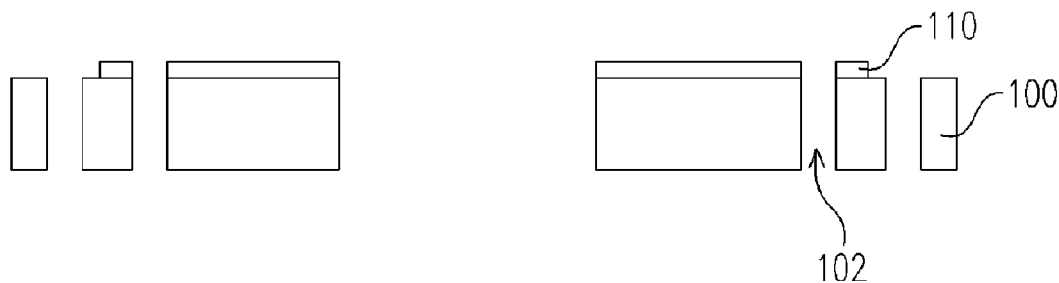
Figure 1C:
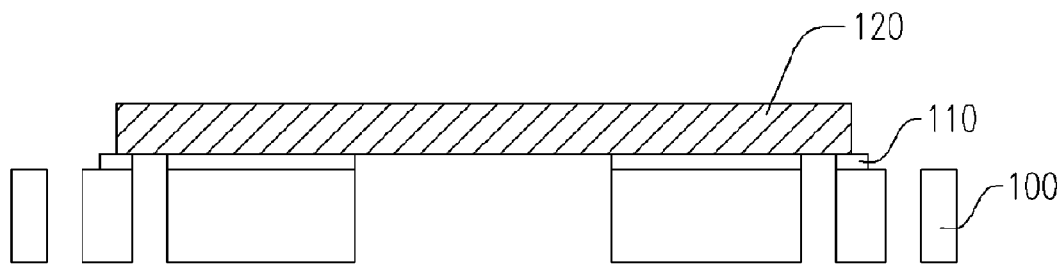
Figure 1D:
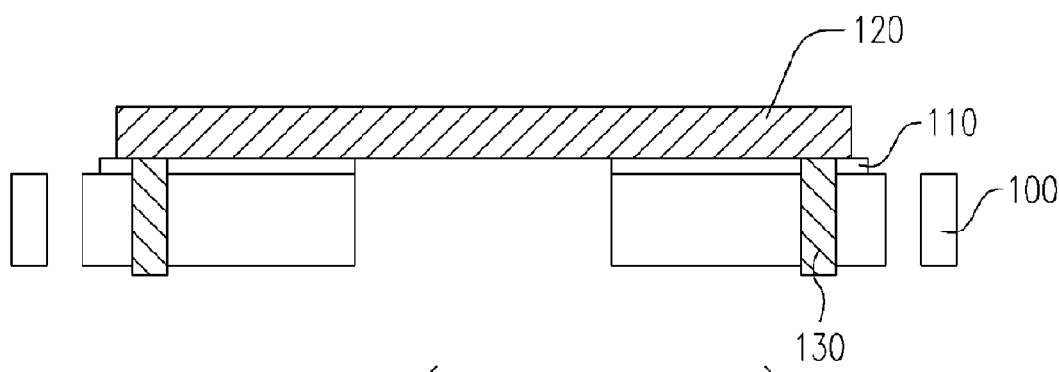
Figure 1E:
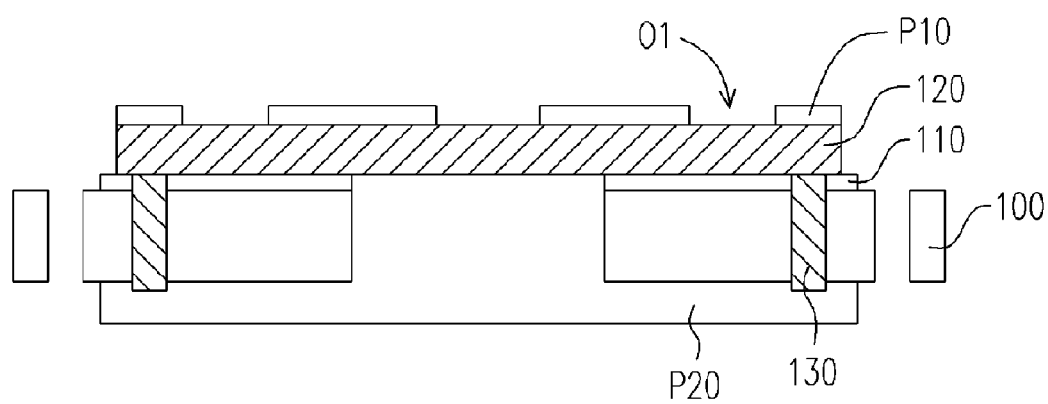
Figure 1F:
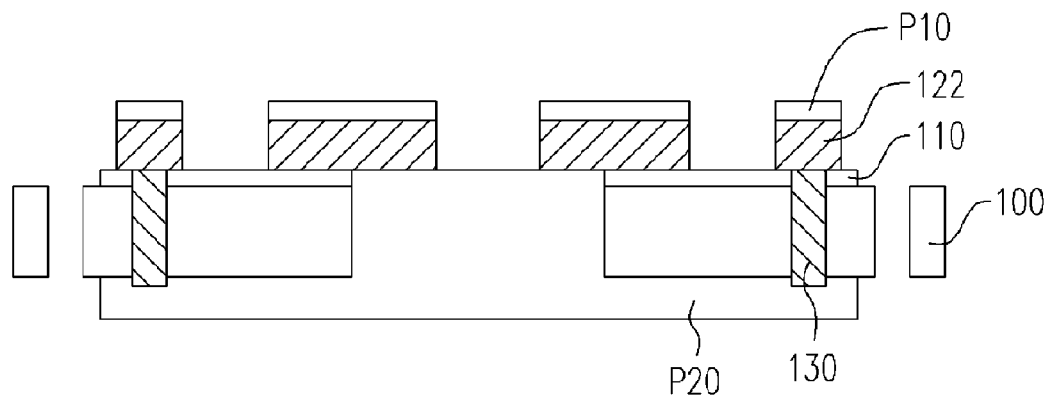
Figure 1G:
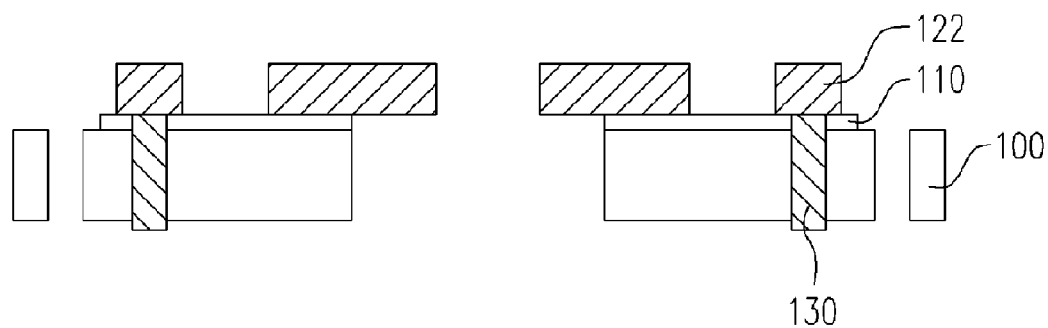
Figure 1H:
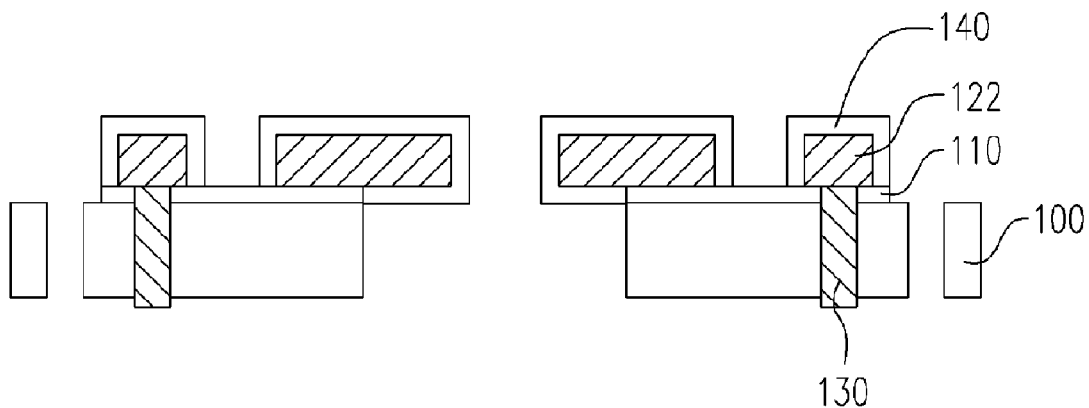
Figure 1I:
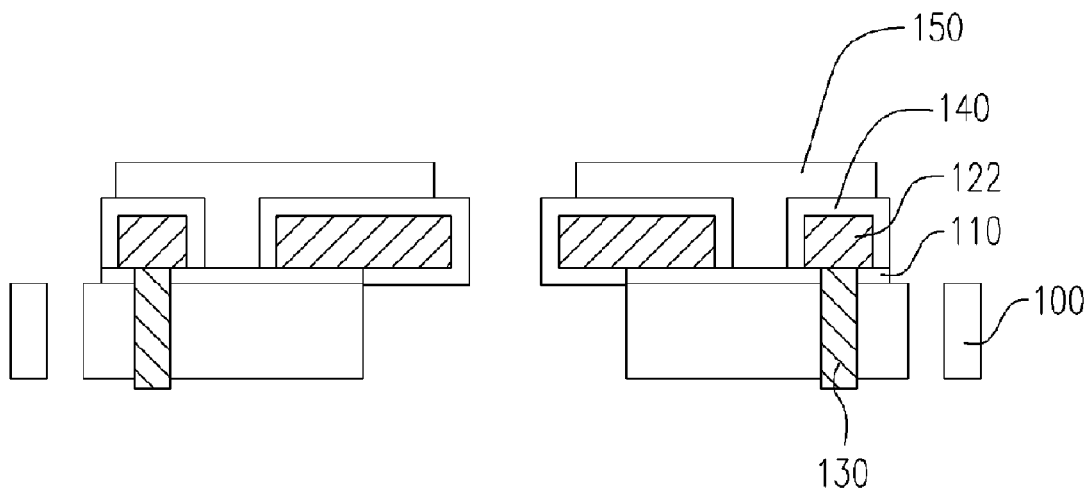
Figure 1J:
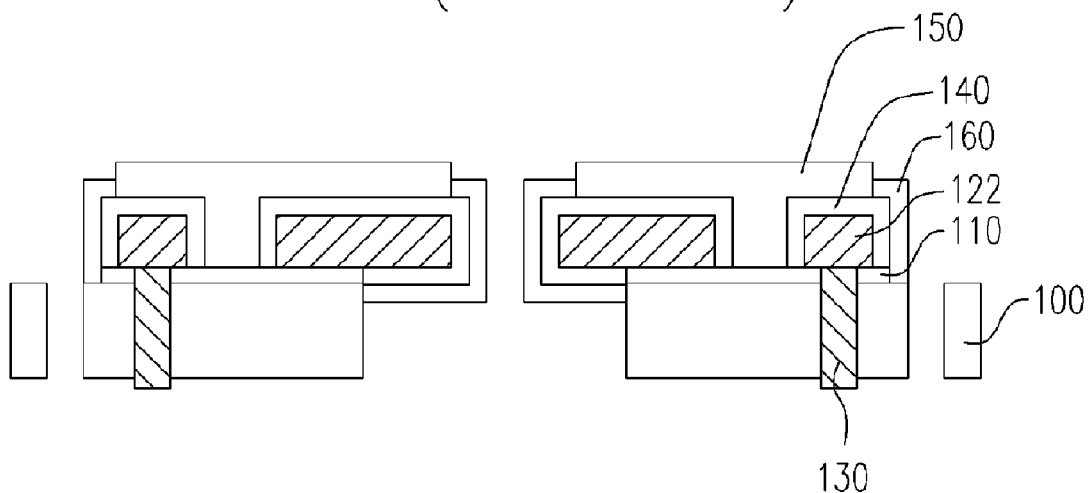

Reference will now be made in detail to the present preferred embodiments of the invention, examples of which are illustrated in the accompanying drawings. Wherever possible, the same reference numbers are used in the drawings and the description to refer to the same or like parts.

Figure 2A:
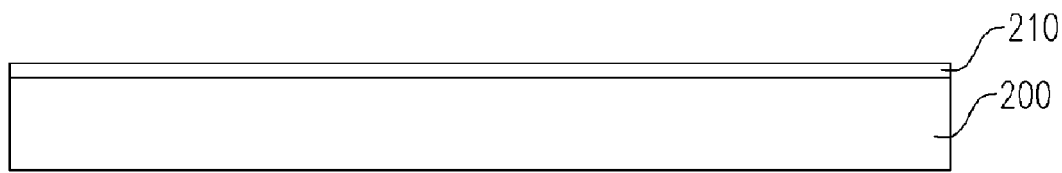
FIGS. 2A through 2J are schematic cross-sectional views showing the progression of steps of fabricating a film carrier according to one embodiment of the present invention.
Figure 2B:
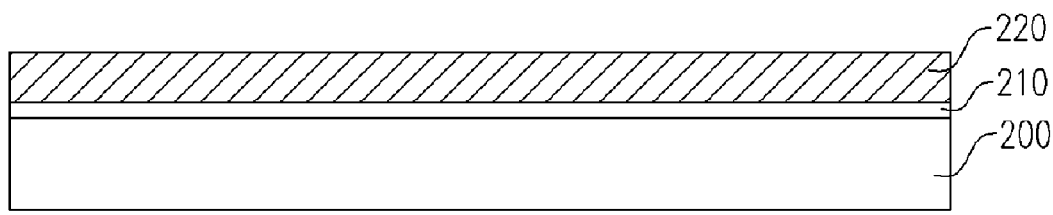
Figure 2C:
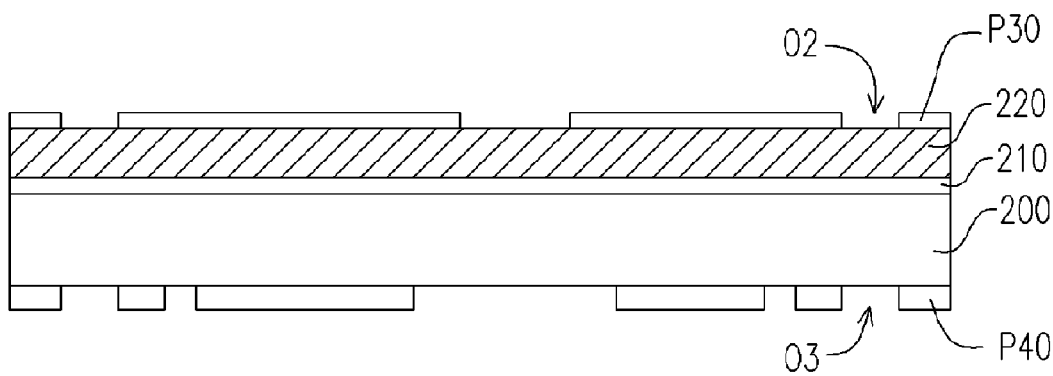
Figure 2D:
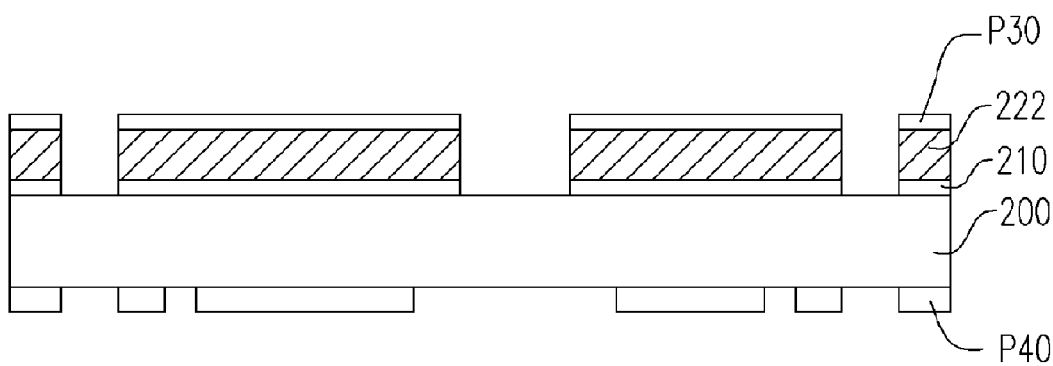
Figure 2E:
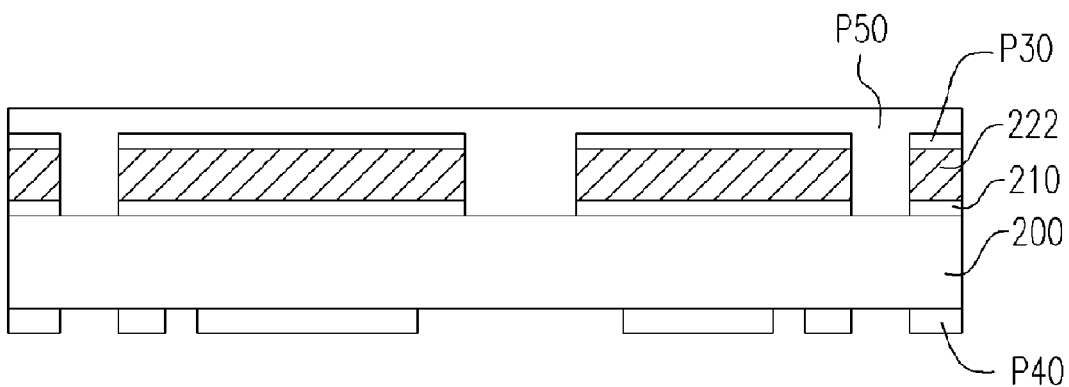
Figure 2F:
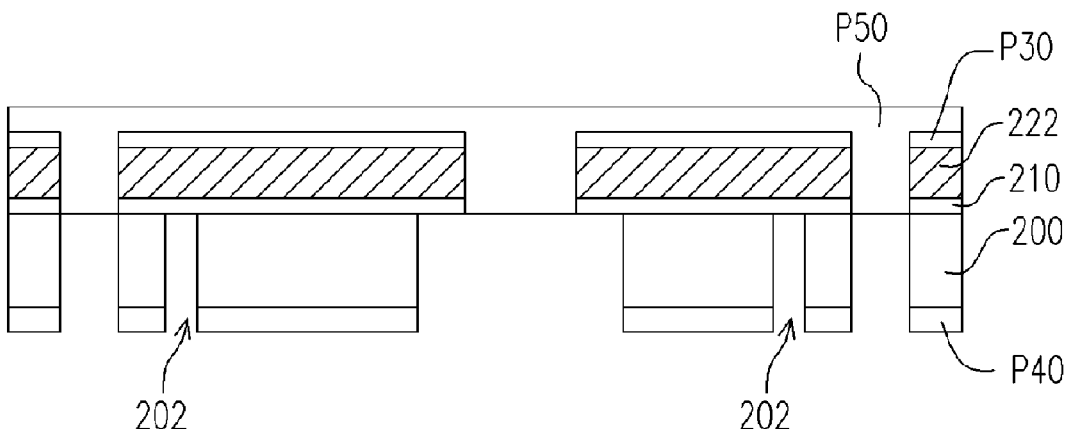

FIGS. 2A through 2J are schematic cross-sectional views showing the progression of steps of fabricating a film carrier according to one embodiment of the present invention. As shown in FIG. 2A, a film 200 such as a polyimide film having an adhesive layer 210 thereon is provided. The adhesive layer 210 mainly serves to increase the adhesive strength of the film 200 with a subsequently added material layer. Thereafter, as shown in FIG. 2B, a metallic layer 220 is formed over the film 200. In the presence of the adhesive layer 210, the bonding strength between the film 200 and the metallic layer 220 is enhanced. The metallic layer 220 is, for example, a copper layer (or copper foil) or other conductive material layer that can be attached to the film 200. Furthermore, a suction drying process to remove moisture may be carried out before forming the metallic layer 220 over the film 200.

As shown in FIGS. 2C through 2G, the metallic layer 220 and the film 200 are respectively patterned to form a plurality of leads 222 and a plurality of openings 202. First, a first photoresist layer P30 is formed over the metallic layer 220 and a second photoresist layer P40 is formed over the film 200 away from the metallic layer 220. Thereafter, the first photoresist layer P30 and the second photoresist layer P40 are photo-exposed and developed to form a plurality of first openings 02 in the first photoresist layer P30 and a plurality of second openings 03 in the second photoresist layer P40 (shown in FIG. 2C). Using the first photoresist layer P30 as an etching mask, a portion of the metallic layer 220 is removed to form a plurality of metallic leads 222 (shown in FIG. 2D). Next, a third photoresist layer P50 is formed over the metallic leads 222 and the first photoresist layer P30 (shown in FIG. 2E). Using the second photoresist layer P40 as an etching mask, a portion of the film 200 is removed to form a plurality of openings 202. According to the locations, the openings 202 serve either as sprocket holes for moving the film 200 or device holes for forming devices. Finally, the first photoresist layer P30, the second photoresist layer P40 and the third photoresist layer P50 are removed (shown in FIG. 2G). In the present embodiment, the first photoresist layer P30 and the second photoresist layer P40 can be dry films or liquid photoresist layers, for example.

Furthermore, before forming the first photoresist layer P30 and the second photoresist layer P40, a surface treatment of the metallic layer 220 may be carried out. The surface treatment includes a chemical polishing or a micro etching process to remove oxide material on the surface of the metallic layer 220, for example.

Figure 2G:
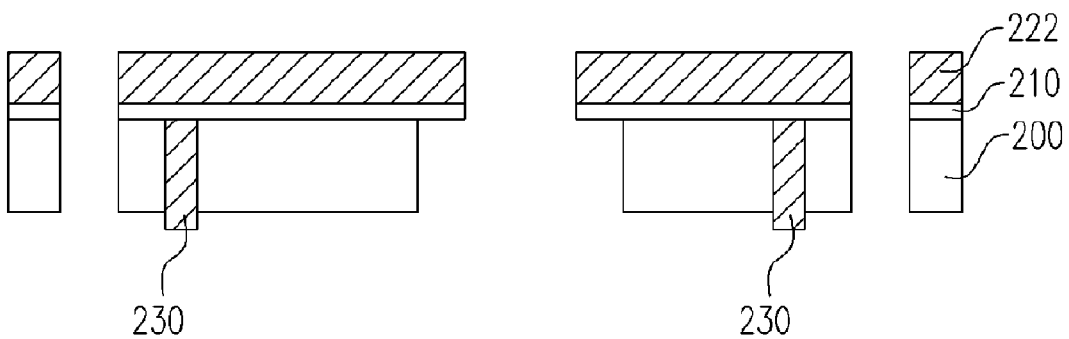

In addition, before removing the first photoresist layer P30, the second photoresist layer P40 and the third photoresist layer P50, a flex coat material may be selectively deposited into some of the openings 202 to form a flex coat layer 230 (shown in FIG. 2G). Through the flex coat layer 230, the film 200 is able to bend along the flex coat layer 230.

Figure 2H:
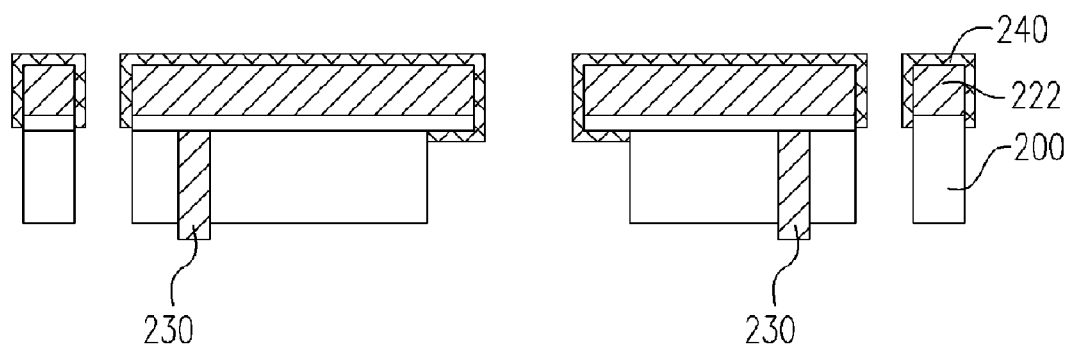
Figure 2I:
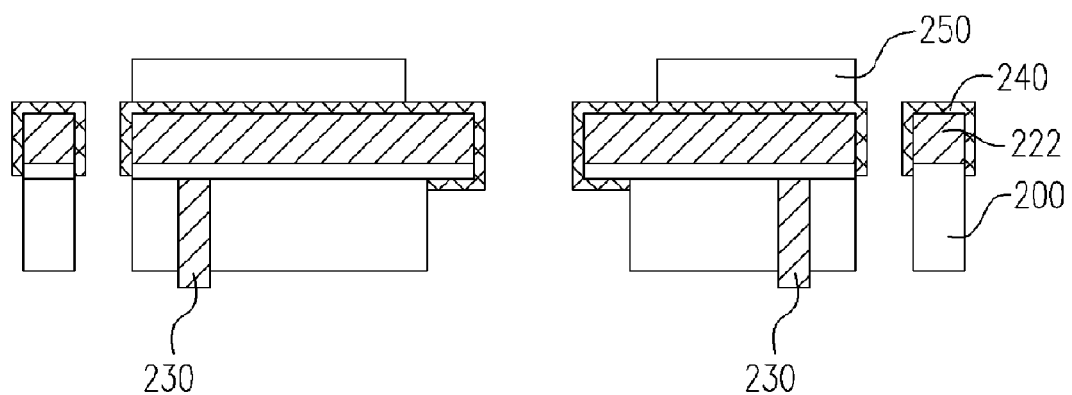
Figure 2J:
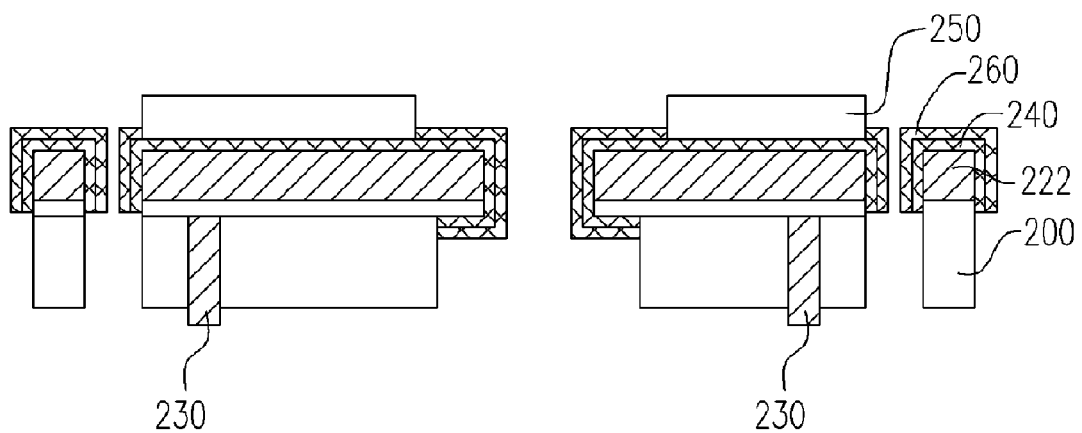

As shown in FIGS. 2H through 2J, a first solder flux layer 240 is formed on the metallic leads 222 (shown in FIG. 2H). The first solder flux layer 240 is a tin layer formed, for example, by performing an electroplating or an electroless plating process. Thereafter, an anti-soldering layer 250 is formed over the surface of a portion of the first solder flux layer 240 (shown in FIG. 2I). The anti-soldering layer 250 prevents the formation of too large a contact area between the bump and the metallic leads 222 in a subsequent packaging process, ultimately leading to the collapse of the bumps. After forming the anti-soldering layer 250, a second solder flux layer 260 may also be formed on the remaining surface of the first solder flux layer 240 (shown in FIG. 2J). Similarly, the second solder flux layer 260 is a tin layer, for example.

After the aforementioned steps, a visual inspection of the finished product is carried out to ensure all the metallic leads are in perfect shape and free from any shorting or broken edges that may affect the reliability of the product.

In summary, the present invention uses photolithographic and etching processes to form all the openings in the film. Therefore, there is no need to fabricate a set of cutting tools when the punching process is used to form the openings. Moreover, the metallic layer is formed over the film prior to forming the openings in the film. Thus, the metallic layer can adhere uniformly to the film surface so that any unevenness around the openings is avoided. Ultimately, product yield of the film carrier is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a film carrier, comprising the steps of:

providing a film;

forming a metallic layer over the film;

forming a first photoresist layer over the metallic layer and a second photoresist layer over the film on a side away from the metallic layer, wherein the first photoresist layer has a plurality of first openings and the second photoresist layer has a plurality of second openings;

removing a portion of the metallic layer to form a plurality of metallic leads using the first photoresist layer as an etching mask;

forming a third photoresist layer over the metallic leads and the first photoresist layer;

removing a portion of the film to form a plurality of openings using the second photoresist layer as an etching mask and the third photoresist layer as an etch stop; and removing the first photoresist layer, the second photoresist layer and the third photoresist layer.

2. The method of claim 1, further comprising a step of forming an adhesive layer over the film before the step of forming the metallic layer.

3. The method of claim 2, wherein the metallic layer comprises a copper layer.

4. The method of claim 1, further comprising a step of performing a surface treatment of the metallic layer before the step of forming the first photoresist layer over the metallic layer and the second photoresist layer over the film layer on the side away from the metallic layer.

5. The method of claim 4, wherein the surface treatment comprises a chemical polishing or micro etching process.

6. The method of claim 1, wherein the first photoresist layer and the second photoresist layer comprise dry films or liquid photoresist layers.

7. The method of claim 1, further comprising a step of depositing a flexible material into some of the openings in the film to form a flexible layer before the step of removing the first photoresist layer, the second photoresist layer and the third photoresist layer.

8. The method of claim 1, further comprising a stop of forming a first solder flux layer over the metallic leads after the step of removing the first photoresist layer, the second photoresist layer and the third photoresist layer.

9. The method of claim 8, wherein the first solder flux comprises a tin layer.

10. The method of claim 8, further comprising a step of forming an anti-soldering layer on the surface of a portion of the first solder flux layer after the step of forming the first solder flux layer over the metallic leads.

11. The method of claim 10, further comprising a step of forming a second solder flux layer over the remaining surface of the first solder flux layer after the step of forming an anti-soldering layer over the surface of a portion of the first solder flux layer.

12. The method of claim 11, wherein the second solder flux layer comprises a tin layer.

13. The method of claim 11, further comprising a step of performing a finished product inspection after the step of forming the second solder flux layer over the remaining surface of the first solder flux layer.

* * * * *